(12) United States Patent
Ma

(10) Patent No.: US 7,150,643 B2
(45) Date of Patent: Dec. 19, 2006

(54) LOADING SYSTEM FOR A LAND GRID ARRAY CONNECTOR ASSEMBLY

(75) Inventor: Hao-Yun Ma, Tu-Chen (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 28 days.

(21) Appl. No.: 11/025,724

(22) Filed: Dec. 28, 2004

(65) Prior Publication Data

US 2005/0202707 A1 Sep. 15, 2005

(30) Foreign Application Priority Data

Mar. 9, 2004 (TW) ............................... 93106160 A

(51) Int. Cl.
*H01R 13/62* (2006.01)
(52) U.S. Cl. ...................... 439/331; 439/342
(58) Field of Classification Search ................ 439/331, 439/342, 73, 66
See application file for complete search history.

(56) References Cited

U.S. PATENT DOCUMENTS

| | | | |
|---|---|---|---|
| 5,482,471 A * | 1/1996 | Mori et al. ................. | 439/263 |
| 6,554,624 B1 * | 4/2003 | Yu ............................. | 439/135 |
| 6,561,825 B1 * | 5/2003 | McHugh et al. ............ | 439/135 |
| 6,722,909 B1 * | 4/2004 | McHugh et al. ............ | 439/331 |
| 6,735,085 B1 * | 5/2004 | McHugh et al. ............ | 361/719 |
| 6,776,625 B1 * | 8/2004 | Ma ............................. | 439/73 |
| 6,780,041 B1 * | 8/2004 | Ma ............................. | 439/73 |
| 6,799,978 B1 * | 10/2004 | Ma et al. ..................... | 439/73 |
| 6,814,604 B1 * | 11/2004 | Lee ............................ | 439/342 |
| 6,832,919 B1 * | 12/2004 | Ma et al. ..................... | 439/73 |
| 6,877,990 B1 * | 4/2005 | Liao et al. .................. | 439/41 |

FOREIGN PATENT DOCUMENTS

TW 568455 12/2003

* cited by examiner

*Primary Examiner*—Tulsidas C. Patel
*Assistant Examiner*—Harshad Patel
(74) *Attorney, Agent, or Firm*—Wei Te Chung

(57) ABSTRACT

A loading system for a land grid array connector assembly includes a base plate (1), a load plate (2), and a load lever (3). The base plate includes a back wall (12) defining a pair of latching beams (124) and a blocking tab (122), and a front wall (18) defining a receiving space and retaining finger (182). The load plate is oriented adjacent the back wall of the base plate and forms a pair of curved latching plates (28) and a blocking tail (24) for cooperating with the latching beams and the blocking tab of the base plate, respectively. The load lever is oriented adjacent the front wall of the base plate and forms an actuating shaft (34) received in the receiving space of the base plate and a curved urging portion (36) engaged with the retaining finger.

15 Claims, 6 Drawing Sheets

LOADING SYSTEM FOR A LAND GRID ARRAY CONNECTOR ASSEMBLY

BACKGROUND OF THE INVENTION

1. Field of the Invention

The present invention relates to an electrical connector for electrically connecting an electronic package such as a central processing unit (CPU) with a circuit substrate such as a printed circuit board (PCB), and particularly to a land grid array (LGA) connector assembly having a loading system for protecting the connector assembly from deformation or warpage.

2. Description of Prior Art

An integrated circuit (IC) package having leads arranged in a land grid array (LGA) is known as an LGA package. LGA packages have relatively low height, which saves valuable space in electronic assemblies.

Connectors for removably mounting an LGA package on a PCB are known as LGA connectors. An LGA connector combined with ball grid array (BGA) technology typically comprises a thin and substantially flat insulative housing which is positioned between the LGA package and the PCB. The housing defines an array of passageways receiving electrical terminals therein. The terminals correspond with the array of leads of the LGA package. Each terminal has a pair of opposite free ends that project beyond opposite top and bottom external surfaces of the housing. Prior to mounting of the LGA package on the PCB, the free ends are spaced apart a predetermined distance. The free ends are respectively engaged with corresponding contact pads on a bottom surface of the LGA package, and soldered to contact pads on a mounting surface of the PCB.

FIG. 7 shows a conventional LGA connector 9 for electrically connecting an LGA package 8 with a PCB (not shown). The connector 9 comprises a housing 91, and a fastening device assembled with the housing 91. The housing 91 has a plurality of passageways (not shown) with a plurality of conductive terminals (not shown) received therein. The fastening device comprises a metal clip 93 and a lever 92 mounted on opposite sides of the housing 91 respectively. The metal clip 93 comprises a pair of locating portions 932, a pair of opposite lateral pressing arms 931, and a driving hook 933 at a free end thereof generally between distal ends of the pressing arms 931. Each locating portion 932 is movably received in a groove 912 of the housing 91. Each pressing arm 931 is bent slightly downwardly at a middle portion 934 thereof. The lever 92 comprises a pair of acting portions 923, a driving portion 922 disposed between and offset from the acting portions 923, and a handle portion 921 bent perpendicularly from a distal end of one of the acting portions 923. Each acting portion 923 is secured in a lock 913 of the housing 91.

In use, the clip 93 is firstly rotated to be perpendicular to the housing 91. The handle portion 921 of the lever 92 is horizontal, and the driving portion 922 is at a highest position. The LGA package 8 is attached on the housing 91. The clip 93 is rotated down to a horizontal position, with the pressing arms 931 abutting against the LGA package 8. The handle portion 921 of the lever 92 is rotated upwardly to be perpendicular to the housing 91, and the driving portion 922 of the lever 92 is received in the driving hook 933 of the clip 93. The handle portion 921 of the lever 92 is rotated down toward the clip 93, and the driving hook 933 is driven downwardly until the clip 93 is in a final pressing position, with the pressing arms 931 firmly pressing the LGA package 8 on the housing 91.

At the final pressing position, the middle portions 934 of the pressing arms 931 apply downward forces on middle portions (not labeled) of the housing 91. The housing 91 at the grooves 912 applies downward forces on the locating portions 932 of the clip 93, thereby locating the locating portions 932 in the grooves 912. The locating portions 932 apply upward counterforces on the housing 91 at the grooves 912. The acting portions 923 of the lever 92 are secured in the locks 913 of the housing 91, with the locks 913 of the housing 91 applying downward forces on the acting portions 923. The acting portions 923 apply upward counterforces on the locks 913 of the housing 91.

Because the housing 91 has a plurality of passageways, a main body of the housing 91 is relatively weak. The housing 91 is subjected to the above-described downward forces acting on the middle portions thereof, and the above-described upward forces acting on two opposite end portions (not labeled) thereof. The opposite ends of the housing 91 are thus prone to warp upwardly and deform the housing 91. When this happens, the clip 93 cannot firmly press the LGA package 8. Therefore, the electrical connection between the conductive terminals of the connector 9 and conductive pads (not shown) of the LGA package 8 may be unstable or even lost.

In view of the above, a new land grid array connector assembly that overcomes the above-mentioned disadvantages is desired.

SUMMARY OF THE INVENTION

Accordingly, an object of the present invention is to provide an LGA connector assembly has a loading system for protecting the connector assembly from deformation or warpage.

To achieve the above-mentioned object, a loading system for a land grid array connector assembly in accordance with a preferred embodiment of the present invention comprises a base plate, a load plate, and a load lever. The base plate comprises a back wall defining a pair of latching beams and a blocking tab, and a front wall defining a receiving space and retaining finger. The load plate is oriented adjacent the back wall of the base plate and forms a pair of curved latching plates and a blocking tail for cooperating with the latching beams and the blocking tab of the base plate, respectively. The load lever is oriented adjacent the front wall of the base plate and forms an actuating shaft received in the receiving space of the base plate and a curved urging portion engaged with the retaining finger. Therefore, the loading system is provided to protect housing from deformation or warpage.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
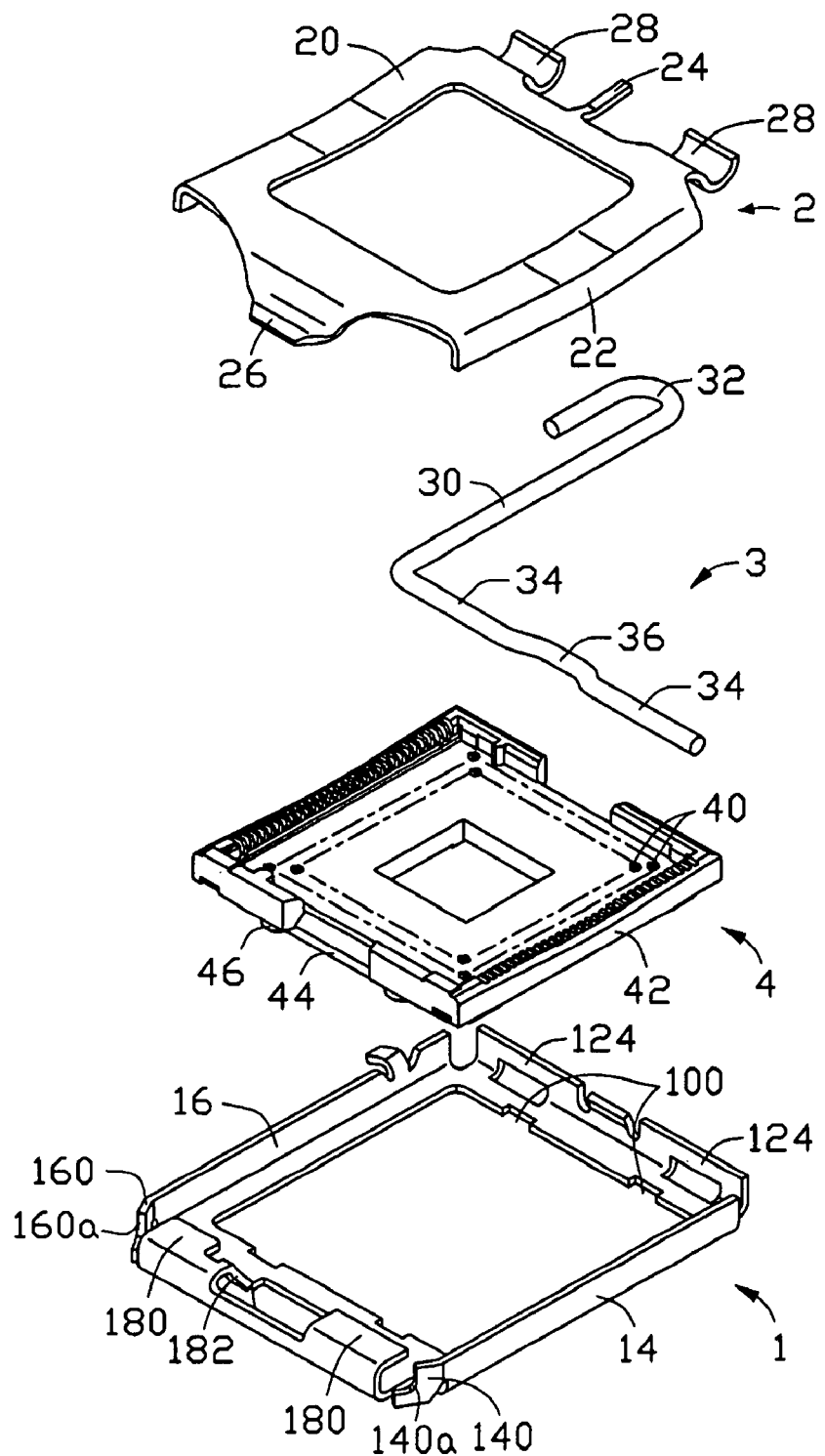
FIG. 1 is an exploded, isometric view of a land grid array connector assembly in accordance with the preferred embodiment of the present invention.

Referring to FIG. 1, a land grid array (LGA) connector assembly in accordance with the preferred embodiment of the present invention is for electrically connecting a land grid array (LGA) package (not shown) with a printed circuit board (PCB) (not shown). The connector assembly comprises an insulative housing 4 with a plurality of conductive terminals 40 received therein, and a loading system assembled with the housing 4.

The housing 4 is generally rectangular, and comprises a top body 42 and a bottom body 44. A plurality of receiving passageways (not labeled) is defined through the top and bottom bodies 42, 44, and receiving corresponding terminals therein. The housing 11 further comprises two pairs of locating posts 46 disposed adjacent four corners of the bottom body 44.

Figure 2:
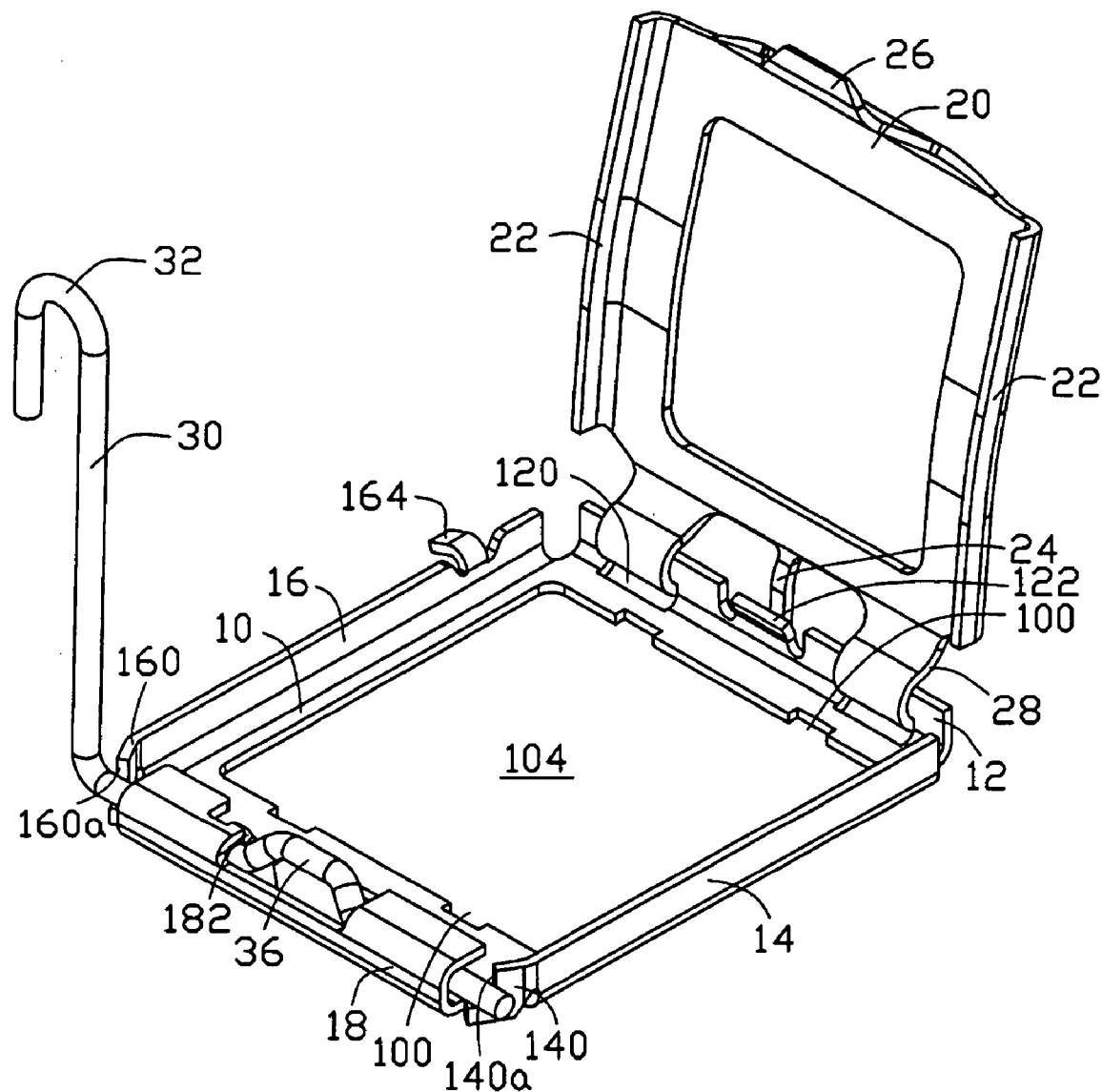
FIG. 2 is an isometric view of a loading system of the connector of FIG. 1, showing the loading system in an open state.
Figure 3:
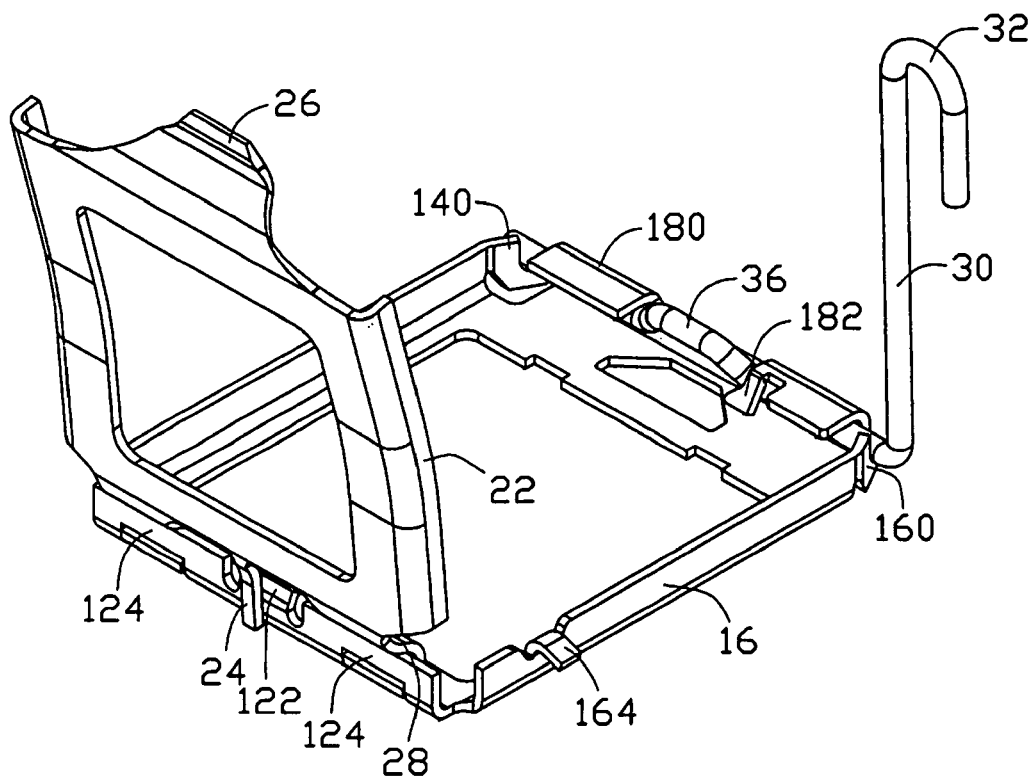
FIG. 3 is similar to FIG. 2, but viewed from another aspect.
Figure 4:
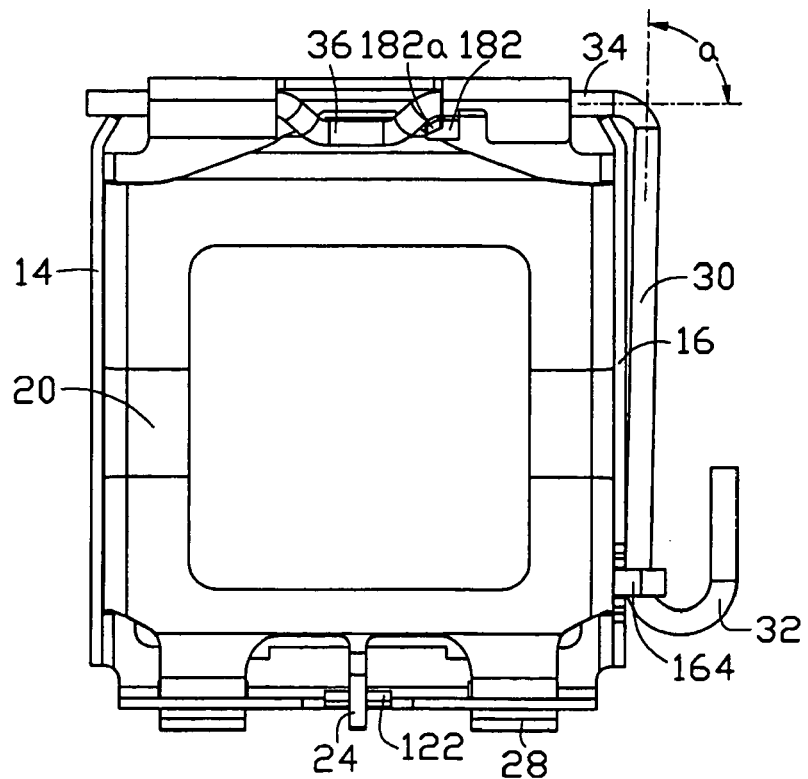
FIG. 4 is a top view of the loading system of FIG. 2, but showing the loading system in a close state.

FIGS. 2–4 show the loading system of the connector assembly. The loading system comprises a base plate 1 surrounding the housing 4, a load plate 2 and a load lever 3 mounted on opposite sides of the base plate 1 respectively.

The base plate 1 is made of strong material, preferably metal. The base plate 1 comprises a substantially rectangular bottom wall 10 with a central opening 104 opened therein. Two pairs of cutouts 100 are formed in the periphery of the central opening 104. The bottom wall 10 bends upwardly and forms a front wall 18, a back wall 12 opposite to the front wall 18, and a pair of side walls 14, 16 respectively interconnecting the front and back walls 18, 12. The front and back walls 18, 12, and side walls 14, 16 cooperatively define a receiving space therebetween to accommodate the housing 4.

The back wall 12 of the base plate 1 further defines a pair of latching beams 124, and a blocking tab 122 oriented between the latching beams 124. A pair of receiving openings 120 is provided adjacent the latching beams 124. Each of the latching beams 124 extends substantially horizontally. The blocking tab 122 extends substantially upwardly, and then bends slightly inwardly. Furthermore, the front wall 18 of the base plate 1 comprises a pair of curved retaining plates 180 forming a receiving space, and a retaining finger 182 provided adjacent one of the retaining plate 180. Each of the retaining plate 180 bends upwardly from the bottom wall 10, and then bends substantially horizontally toward the back wall 12. The retaining finger 182 is punched from one of the retaining plate 180 to form a curved face 182a and then bends aslant downwardly The side walls 14, 16 bend upwardly from the bottom wall 10. Each of the side walls 14, 16 has a locking ear 140, 160 defined at one end of the side walls 14, 16 respectively adjacent the front wall 18. The locking ears 140, 160 are punched to form a curved face 140a, 160a respectively, and then bend slight toward the retaining plates 180 of the front wall 18. In addition, the side wall 16 has a curved tab 164 bending slightly downwardly away from the side wall 14.

The load plate 2 is also made of strong material, preferably metal, which comprises a main body 20 having a generally rectangular opening therein, a pair of curved latching plates 28 extends from the main body 20, and a blocking tail 24 oriented between the curved latching plates 28. The load plate 2 further comprises a pair of opposite lateral pressing wings 22, and a driving hook 26 at a free end thereof generally between distal ends of the pressing wings 22. The pressing wings 22 are bent slightly downwardly in middle thereof.

The load lever 3 comprises an operation lever 30, a handle 32 extending from a distal end of the operation lever 30, a pair of acting portions 34 defined at opposite end of the operation lever 30, and a driving portion 36 disposed between and offset from the acting portions 34. The operation lever 30 and the acting portion 34 are oriented such that the angle denoted by "a" therebetween is less than 90 degrees, preferably 85 degrees (as shown in FIG. 4). Under this arrangement, when the connector is in a closed position, the operation lever 30 may be essentially, in part, laterally engaged with or abut against the side wall 16 efficiently in a tensioned manner. Understandably, such a partial engagement may be performed by some protrusions formed on one of the side wall 16 and the operation lever 30 to abut against the other. On the other hand, the partial engagement between the side wall 16 of the metallic base plate 1 and the metallic operation lever 30 may be beneficial for the heat transfer and grounding consideration.

Referring to FIGS. 1–6, assembly of the loading system and assembly of the housing 4 with the loading system are as follows.

Firstly, the load lever 3 is assembled to the base plate 1. The load lever 3 is inserted into the receiving space of the base plate 1 in a direction from the side wall 16 toward the side wall 14. When the acting portions 34 of the load lever 3 are located on the curved face 140a, 160a of the locking ears 140, 160 respectively, the retaining finger 182 is bent downwardly to block the driving portion 36 for preventing the load lever 3 from escaping the receiving space and disassembling with the base plate 1.

Secondly, the load plate 2 is assembled to the base plate 1. The curved latching plates 28 of the load plate 2 are inserted into the receiving openings 120 of the base plate 1 when the load plate 2 is in an open state (as shown in FIGS. 2 and 3). Then, the blocking tail 24 of the load plate 2 is slightly bent inwardly, and the blocking tab 122 of the base plate 1 is slightly bent outwardly to engage with the inwardly bent blocking tail 24. Therefore, when the load plate 2 is oriented in the open state, the abutting engagement between the blocking tail 24 and the blocking tab 122 prevents the disassembly between the load plate 2 and the base plate 1 in the horizontal direction. In addition, the pivotably engagement between the curved latching plates 28 and the latching beams 124 prevents the disassembly between the load plate 2 and the base plate 1 in the vertical direction. When the load plate 2 is in a closed state relevant to the base plate 1, the engagement between the curved latching plates 28 and the latching beams 124 prevents the disassembly between the load plate 2 and the base plate 1 both in the vertical direction and the horizontal direction (as shown in FIG. 4). Therefore, the load plate 2 secures to the base plate 1 both in the open state and the closed state.

Figure 5:
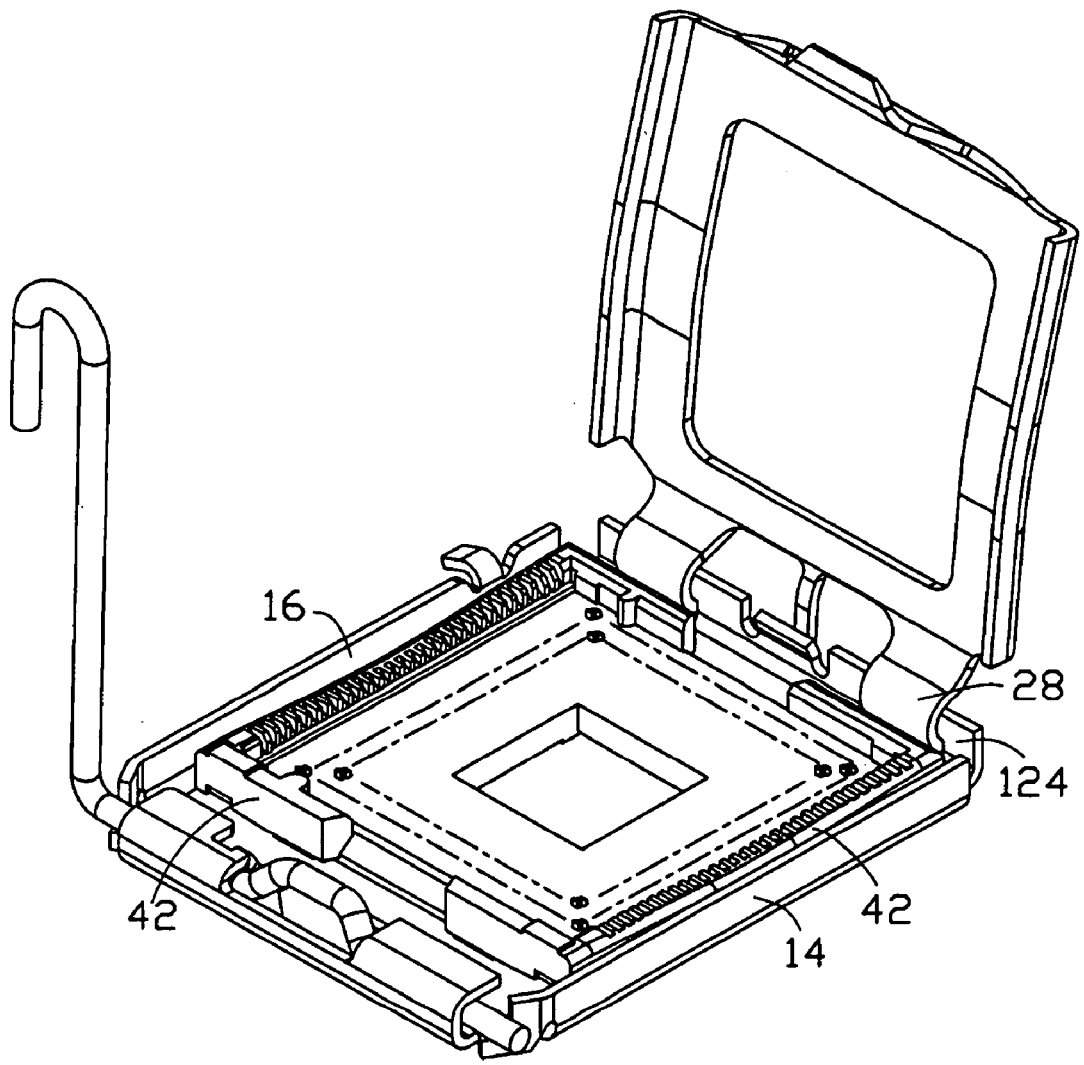
FIG. 5 is an assembled view of FIG. 1.
Figure 6:
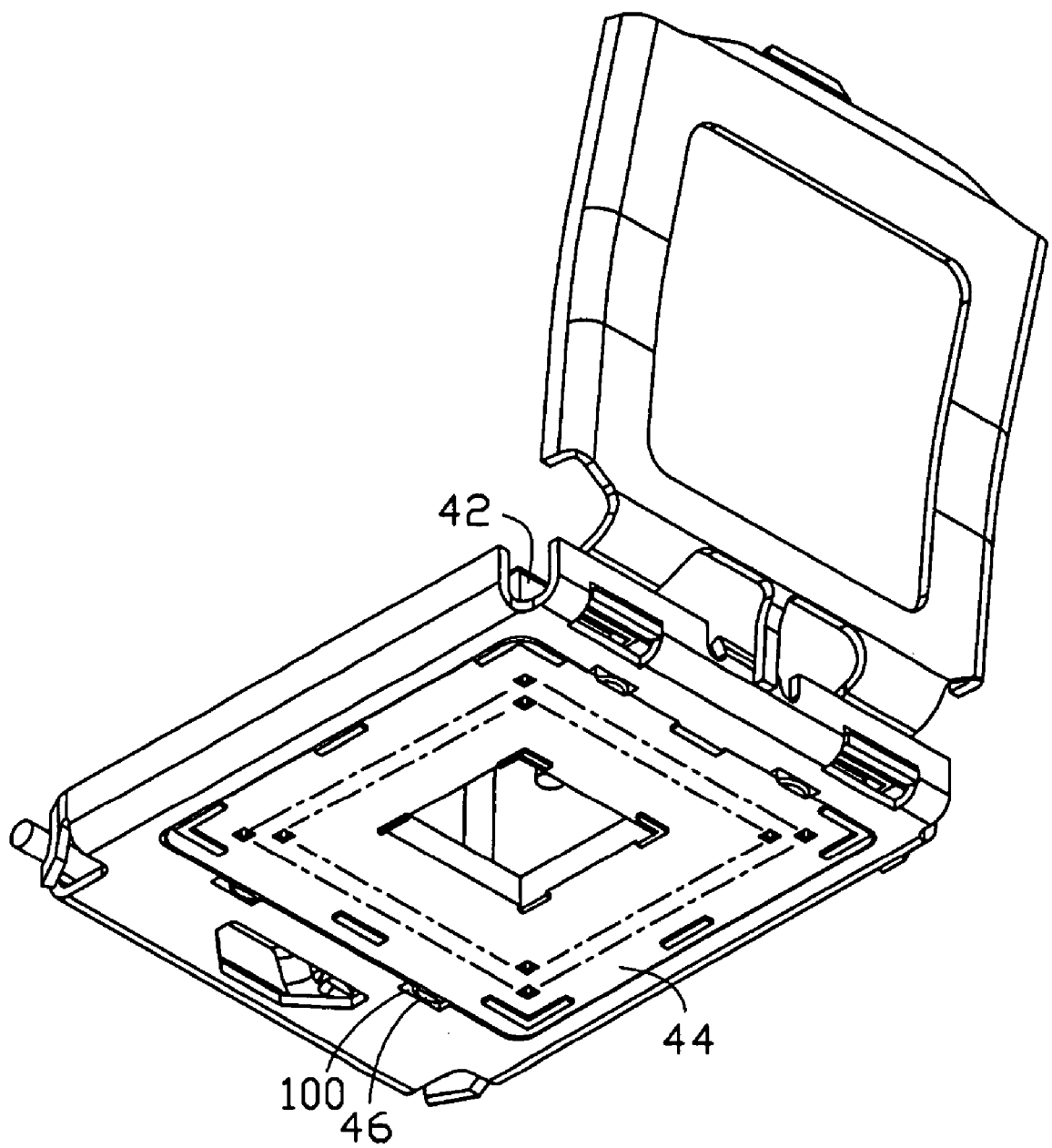
FIG. 6 is similar to FIG. 5, but viewed from another aspect.
Figure 7:
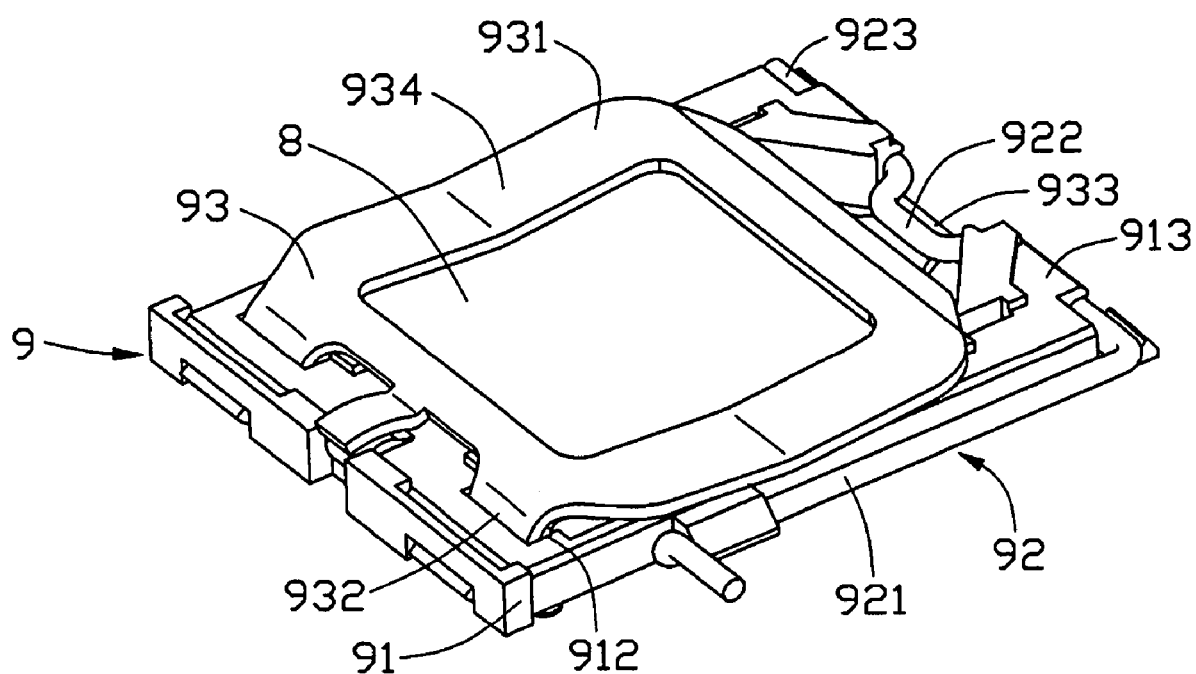
FIG. 7 is an isometric view of a conventional land grid array connector assembly.

FIGS. 5 and 6 show the housing 4 is loaded to the loading system. Firstly, the locating posts 46 of the housing 4 are aligned with the corresponding cutouts 100 of the base plate 1. Then, the housing 4 is inserted into the base plate 1, such that the top body 42 is supported by the bottom wall 10 of the base plate 1, and the bottom body 44 is received in the central opening 104 and exposed to face against the PCB.

Therefore, when the terminals 40 are mechanically and electrically connected to the PCB, movement of the base plate 1 is limited by the top body 42 and the bottom body 44 both in a perpendicular direction and a horizontal direction.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. A loading system for a land grid array connector assembly comprising:
    a base plate comprising a back wall defining a pair of latching beams and a blocking tab, and a front wall defining a receiving space and retaining finger;
    a load plate oriented adjacent the back wall of the base plate and defining a pair of curved latching plates and a blocking tail for cooperating with the latching beams and the blocking tab of the base plate, respectively; and
    a load lever oriented adjacent the front wall of the base plate and defining an actuating shaft received in the receiving space of the base plate and a curved urging portion engaged with the retaining finger; wherein
    the load lever comprises an operation shaft extending from the actuating shaft and forming an angle therebetween, such that the angle is less than 90 degrees.

2. The loading system as claimed in claim 1, wherein the back wall comprises a pair of receiving openings provided adjacent the latching beams, thus the curved latching plates can be inserted into the receiving openings.

3. The loading system as claimed in claim 1, wherein the load plate is pivotally engaged with the base plate and can pivot from an open state to a closed state, and the latching beam of the base plate comprises a top edge and a bottom edge.

4. The loading system as claimed in claim 3, wherein when the load plate is in the open state, the top edge engages with the curved latching beam, and the blocking tab engages with the blocking tail, such that unduly pivoting of the load plate is prevented.

5. The loading system as claimed in claim 3, wherein when the load plate is in the open state, the bottom edge engages with the curved latching beam, such that unduly detachment between the load plate and the base plate is prevented.

6. The loading system as claimed in claim 1, wherein the base plate comprises a pair of side walls defined between the front wall and the back wall, and the load lever is pivotally engaged with the base plate and can pivot from an open state to a closed state.

7. The loading system as claimed in claim 6, wherein the load lever comprises an operation shaft, such that when the load lever is in the closed state, the operation shaft abuts against the side wall of the base plate, while the curved urging portion engaged with the retaining finger.

8. The loading system as claimed in claim 6, wherein a pair of locking ears is defined on the side walls and engages the actuating shaft.

9. An electrical connector assembly comprising:
    a base plate comprising a bottom wall defining a central opening therein; and
    an insulative housing having a plurality of terminals for electrically connecting to a circuit substrate, a top body supported by the bottom wall of the base plate, and a bottom body received in the central opening and exposed to face against the circuit substrate;
    wherein when the terminals are electrically connected to the circuit substrate, movement of the base plate is limited by the top body and the bottom body in a perpendicular direction and a horizontal direction, respectively; wherein
    a load plate is locked by a load lever which comprises an operation shaft extending from an actuating shaft and forming an angle therebetween, such that the angle is less than 90 degrees.

10. The electrical connector assembly as claimed in claim 9, wherein a cutout is formed in the periphery of the central opening, and a locating post is formed on the bottom body of the housing to engage in the cutout.

11. The electrical connector assembly as claimed in claim 9, further comprises a load plate pivotally mounted on the base plate and having two wings on opposite edges thereof.

12. The electrical connector assembly as claimed in claim 11, wherein when the load plate is in a closed state, the wing of the load plate is sandwiched between the top body and the base plate.

13. The electrical connector assembly as claimed in claim 9, wherein a cutout is formed in the periphery of the bottom opening, and a locating post is formed on the bottom body to engage in the cutout.

14. An electrical connector assembly comprising:
    a metallic base plate retaining an insulative housing therein;
    an upward cavity formed in the housing;
    a plurality of terminals disposed in the housing with upper contacting portions extending into the cavity;
    an electronic package received in the cavity and mechanically and electrically connected to the terminals;
    a metallic load plate pivotally mounted to one end of the base plate and pressing downward against the electronic package;
    a metallic load lever pivotally mounted to the other end of the base plate and adapted to lock the load plate in position;
    the metallic load lever defining an acting shaft engegeable with the load plate when the load plate is in a locked position, and an operation shaft extending from one end of the acting shaft roughly along a corresponding side wall of the metallic base plate, and when the load plate is in the locked position, said load lever being partially engaged with the side wall laterally so as to keep the operation shaft and the associated load lever in a tensioned manner; wherein
    partial engagement between the metallic load lever and the side wall of the metallic base plate not only increases mechanical securement of the load plate against the electronic package in the connector but also benefits heat transfer and grounding consideration for the whole connector assembly.

15. The connector assembly as claimed in claim 14, wherein said partial engagement between the load lever and the side wall is implemented by providing an intersection angle between the operation shaft and the acting shaft, which is less than 90 degrees.

* * * * *